US009064622B2

(12) United States Patent
Len

(10) Patent No.: US 9,064,622 B2
(45) Date of Patent: Jun. 23, 2015

(54) RF RESISTOR WITH LOSSY TRACES

(71) Applicant: Anaren, Inc., East Syracuse, NY (US)

(72) Inventor: Michael J. Len, Skaneateles, NY (US)

(73) Assignee: Anaren, Inc., East Syracuse, NY (US)

( * ) Notice: Subject to any disclaimer, the term of this patent is extended or adjusted under 35 U.S.C. 154(b) by 219 days.

(21) Appl. No.: 13/800,765

(22) Filed: Mar. 13, 2013

(65) Prior Publication Data

US 2014/0077924 A1    Mar. 20, 2014

Related U.S. Application Data

(60) Provisional application No. 61/701,396, filed on Sep. 14, 2012, provisional application No. 61/709,655, filed on Oct. 4, 2012.

(51) Int. Cl.
| | |
|---|---|
| *H01C 1/012* | (2006.01) |
| *H01C 1/00* | (2006.01) |
| *H03H 7/24* | (2006.01) |
| *H05K 1/16* | (2006.01) |
| *H05K 1/02* | (2006.01) |
| *H05K 3/46* | (2006.01) |

(52) U.S. Cl.
CPC .. *H01C 1/00* (2013.01); *H03H 7/24* (2013.01); *H05K 1/167* (2013.01); *H05K 1/0218* (2013.01); *H05K 1/0265* (2013.01); *H05K 3/4629* (2013.01); *H05K 2201/09263* (2013.01); *H05K 2201/09618* (2013.01); *H05K 1/0234* (2013.01); *H05K 1/024* (2013.01); *H05K 2201/068* (2013.01); *H05K 2201/09672* (2013.01)

(58) Field of Classification Search
CPC ....... H01C 1/00; H05K 1/024; H05K 1/0265; H05K 1/0218; H05K 1/0234; H05K 1/167; H05K 2201/068; H05K 2201/09263; H05K 2201/09618; H05K 2201/09672; H01P 5/10; H03B 5/1882; H03B 5/40; H03H 7/24
USPC .......................................... 338/314; 333/22 R
See application file for complete search history.

(56) References Cited

U.S. PATENT DOCUMENTS

| | | | | |
|---|---|---|---|---|
| 3,678,417 | A * | 7/1972 | Ragan et al. ................. | 333/22 R |
| 3,740,676 | A * | 6/1973 | Garuts ......................... | 333/81 A |
| 5,266,036 | A * | 11/1993 | Lichtenwalter et al. ......... | 439/65 |
| 5,999,064 | A * | 12/1999 | Blacka et al. ................ | 333/81 R |
| 6,147,481 | A * | 11/2000 | Mazzochette et al. .......... | 324/95 |
| 6,326,862 | B1 * | 12/2001 | Ferguson et al. ............ | 333/22 R |
| 6,775,122 | B1 * | 8/2004 | Dishongh et al. .......... | 361/301.5 |
| 7,755,447 | B2 * | 7/2010 | Oshima ........................... | 333/26 |

* cited by examiner

*Primary Examiner* — Kyung Lee
(74) *Attorney, Agent, or Firm* — Frederick J. M. Price; Daniel P. Malley; Bond Schoeneck & King, PLLC

(57) ABSTRACT

An RF power resistor includes: a lossy layer; and a dielectric layer. The lossy layer is shaped and/or sized as a transmission line. The lossy layer is made of a lossy material. The dielectric layer is made of a dielectric material. The lossy layer and the dielectric material are located to be adjacent to each other and in contact with each other.

20 Claims, 8 Drawing Sheets

ISOMETRIC VIEW
TOP

ISOMETRIC VIEW
BOTTOM

EXPLODED VIEW

EXPLODED VIEW
LAYER GROUPS

LAYER 5

LAYER 4

LAYER 3

LAYER 2

LAYER 1

RF RESISTOR WITH LOSSY TRACES

CROSS-REFERENCE TO RELATED APPLICATIONS

The present application claims the benefit of U.S. Provisional Patent Application No. 61/701,396, filed Sep. 14, 2012, and of U.S. Provisional Patent Application No. 61/709,655, filed Oct. 4, 2012, each of which is hereby incorporated by reference in their respective entireties.

BACKGROUND OF THE INVENTION

1. Field of the Invention

The present invention relates generally to RF components, and particularly to RF Power resistors.

2. Technical Background

In one approach that has been considered, a conventional RF power resistor 100 is shown in FIG. 10. Resistor 100 includes: a substrate material 102; conductive traces 104; and a resistive structure 106. The substrate material is typically fired and lapped ceramic, with BeO, AlN (aluminum nitride) or Alumina being typical substrate materials. Secondary processing includes making holes and slots, typically drilled by a laser as needed. The conductive traces and pads are typically made of silver (Ag) (printed Ag paste).

In resistor 100, resistive structure 106 is typically made from a resistive paste that is made of a mixture of materials as is known in the prior art (as is printed on the ceramic substrate 102). The resistive structure is a single layer structure. It is not a transmission line as it is typically much wider (in a direction transverse to current flow) than the impedance desired on the input port, hence transmission line is used for matching the relatively wide resistor to the desired impedance. Herein, this type of resistor will be called a "widepath resistor" or a "widepath structure" in order to distinguish this kind of structure from a transmission line structure.

Because of the geometry and/or material used to make widepath resistor 106, the widepath resistor itself must be tuned, which is costly and labor intensive. Some other recognized performance limitations of conventional widepath resistors are as follows:

(i) maximum temperature limit between 200 C to 250 C;

(ii) performance drift when operated at or above 200 C for extended duration;

(iii) hard failure if operated above 250 C;

(iv) as resistor footprint increases to become greater than 0.5 by 0.5 inches the risk of cracking drastically increases; and (v) Labor intensive manufacturing process (for example, must generally tune each resistor individually);

With respect to issue (iv) listed above, the cracking risk is due to coefficients of thermal expansion ("CTE") mismatch between the ceramic substrate and the widepath resistor structure, and it is believed to be an exponentially increasing cracking risk as footprint area increases. Historically, 50% yields have been observed for 1.0 square inch square resistors of the type corresponding to resistor 100.

By way of background, a "delay line" (which is not considered to be an RF power resistor or analogous to an RF power resistor) is a non-resistor device that is used to control the timing of an RF signal. While a delay line device will generally attenuate the input signal a certain amount, delay lines are designed to minimize attenuation and are configured to act as little like resistors as possible. A delay line device includes a long transmission line structure (not a widepath structure) which includes: (i) a highly conductive layer, with traces; and (ii) a dielectric material layer. The highly conductive material is typically copper and the dielectric material is typically made of circuit board material. Because the highly conductive material is highly conductive, the use of the delay line will not generate much heat which is why simple circuit board material (as opposed to ceramic or the like) can be used for the dielectric layer.

The following published document(s) (which may or may not legally constitute prior art) may also include helpful background information: US patent application 2008/0258838 ('838 Oshima").

Technical Background Section Disclaimer: To the extent that specific publications are discussed above in this Technical Background Section, these discussions should not be taken as an admission that the discussed publications (for example, published patents/patent applications) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Technical Background Section, they are all hereby incorporated by reference into this document in their respective entirety(ies).

SUMMARY OF THE INVENTION

One aspect of the present invention is directed to an RF power resistor includes a dielectric layer, which can be a lossy layer (which can absorb RF signal), and a trace layer, which can also be a lossy layer. The trace layer can be shaped and/or sized as a transmission line (and not as a widepath structure). Each of the dielectric layer and trace layer can be made of a lossy material (see DEFINITIONS section). The dielectric layer can also be made of a dielectric material. The trace layer and the dielectric material (combination can be referred to as a "lossy layer with traces") are located to be adjacent to each other and in contact with each other. Typically, circuit boards select the lowest loss dielectric material for RF circuits. This will result in the most power being transmitted through the circuit. In an embodiment of the present invention, dissipate the power is desired. Therefore, a material was selected which does transmit the RF signal, but where some of the signal is dissipated as heat in the dielectric material.

In some embodiments of the present invention, a multilayer transmission line structure is assembled utilizing AlN or similar dielectric and Tungsten or similar lossy conductor with an impedance (for example can be 50 ohm or any impedance and transformed as required) trace geometry to attenuate the signal to a low power (for example, to less than 1 watt). In some embodiments, the trace would generally be geometrically configured with turns (for example, spiraled, meandered or otherwise distributed) on the layer or layers as a lossy trace to dissipate the attenuated power as heat. The end of the trace can be open circuited, shorted (resulting in the signal being reflected back to the input), terminated (a small termination can be printed or mounted) or as used an attenuator with a second port for the output signal.

In implementing various embodiments of the present invention, care should be exercised with respect to the following performance parameters and/or potential performance issues: (i) RF performance; (ii) potential design issues related to metal plane between layers; and (iii) bond of multi layers. In embodiments of the present invention with relatively small trace width, a smaller package footprint may render the present invention relatively less effective at lower frequencies, say below 3 GHz, when measured in power per a given real estate, as compared to conventional technologies, but the present invention is believed to be superior for many, if not most, geometries and/or scales. In higher frequency applications however, say above 3 GHz, this structure may provide a better size/performance trade-off. For example below 2 GHz, 1.0 square inch at 500 W to 1000 W appears to be achievable using the structures and/or techniques of the present invention in conjunction with current manufacturing and materials capabilities.

In another embodiment of the present invention, a spiral circuit layout, rather than an otherwise meandered layout, may provide thermal performance advantages for a given application. In another embodiment of the present invention, a first spiral will be disposed to dissipate heat at the bottom of the stack up to obtain a desired thermal performance.

Buried vias may be employed for layer-to-layer connections in order to yield a more compact device. In some design approaches that have been considered, buried vias are used with no thru vias. In embodiments that do not employ buried vias, ground vias should preferably be staggered and interconnected with pads from layer to layer.

In another embodiment, an RF power resistor assembly is provided and includes one or more of the following: a first trace layer unit comprising a first dielectric layer including a first ground layer disposed on a first surface of the first dielectric layer; a second ground layer disposed opposite a second side of the first dielectric layer; and a first trace layer disposed between the first dielectric layer and the second ground layer. The first trace layer unit can further comprise a second dielectric layer disposed between the first trace layer and the second ground layer. The RF power resistor assembly can also include a second trace layer unit comprising: a third dielectric layer disposed on a first surface of the first ground layer; a fourth dielectric layer including a third ground layer disposed on a first surface of the fourth dielectric layer; and a second trace layer disposed between the third dielectric layer and the fourth dielectric layer.

Various embodiments of the present invention may exhibit one or more of the following objects, features and/or advantages: (i) Improved reliability; (ii) Reduced performance change as a function of temperature when operated above the typical resistor operating temperature range (e.g., in the 200 to 250° C. range); (iii) improved CTE matching of adjacent layers (for example a lossy tungsten trace layer is well-matched with an aluminum nitride dielectric layer), thereby reducing the risk of cracking the conductor due to CTE mismatch; (iv) reduced and/or eliminated drift in electrical performance over time with high heat exposure, relative to the current technology; (v) Increased reliability for pulsed RF power applications (typical resistors have poor reliability in pulsed RF power applications due to thermal stress generated from CTE mismatch between the materials); (vi) better CTE matching by avoiding the use of conventional resistive paste materials and/or their associated widepath structures; (vii) reduced thermal stress and reduced failure rates; (viii) Increased stability at maximum operating temperature; (ix) Increased maximum operating temperature; (x) Increased power handling or reduced part real estate; (xi) Simplified manufacturing; (xii) Only one paste required (tungsten or similar lossy material); (xiii) Do not have to mix paste to a specified resistive value, and avoids issues associated with improper mixing; (xiv) No tuning required and no trimming required; (xv) Better utilization of real-estate for dissipated power and/or lower heat flux; and/or (xvi) while certain performance characteristics may change as a function of frequency, these changes are predictable and can be accommodated by design.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

The present invention will be more fully understood and appreciated by reading the following Detailed Description in conjunction with the accompanying drawings, in which.

DETAILED DESCRIPTION

Reference will now be made in detail to the present exemplary embodiments of the invention, examples of which are illustrated in the accompanying drawings. Wherever possible, the same reference numbers will be used throughout the drawings to refer to the same or like parts. Exemplary embodiments of the present invention are shown in FIGS. 1-9.

Figure 1:
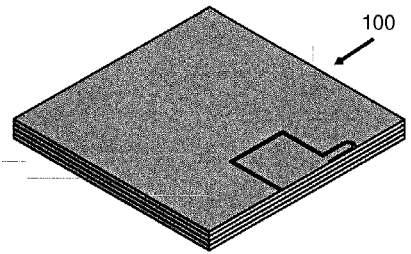
FIG. 1 is a top isometric view of an RF power resistor assembly in accordance with an embodiment of the present invention.
Figure 2:
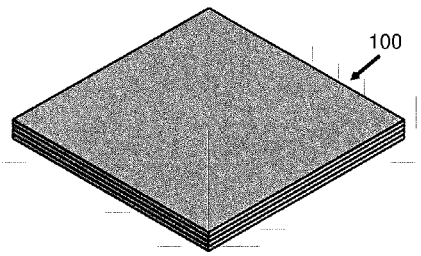
FIG. 2 is a bottom isometric view of an RF power resistor assembly in accordance with an embodiment of the present invention.

As shown in FIG. 1, a top isometric view of an RF power resistor assembly 100 in accordance with an embodiment of the present invention is provided. FIG. 2 shows a bottom isometric view of an RF power resistor assembly 100 in accordance with an embodiment of the present invention.

Figure 3:
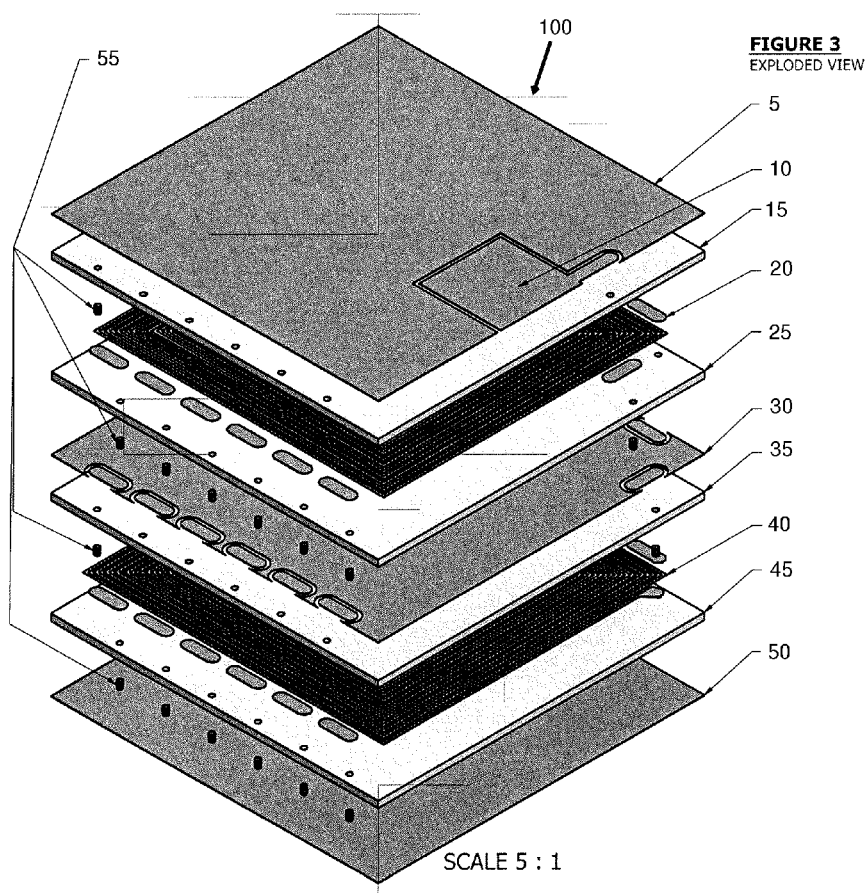
FIG. 3 is an exploded isometric view of an RF power resistor assembly in accordance with an embodiment of the present invention.

FIG. 3 shows an exploded isometric view of an RF power resistor assembly 100 in accordance with an embodiment of the present invention. The RF power resistor assembly can include, but is not limited to a first/top conductive ground layer 5, an input pad 10 on the top surface of the top conductive ground layer 5, a first dielectric layer 15, a first trace layer 20, a second dielectric layer 25, a second/central conductive layer 30, a third dielectric layer 35, a second trace layer 40, a fourth dielectric layer 45, a third/bottom conductive ground layer 50, and vias 55.

As shown in FIG. 3, a stripline approach is depicted. The illustrated RF power resistor assembly 100 can be manufactured utilizing co-fired ceramic build process. The green ceramic (dielectric layers 15, 25, 35, and 45) is punched for required through holes (vias 50). The through holes can be filled with a conductive material. The circuit trace metallization (trace layers 20 and 40) can be printed on the respective dielectric layers. The dielectric layers with trace layers metallization are preferably stacked-up in the correct order, as shown. This means that each layer of metal traces is unique within the stack up. Each layer will have a unique beginning and end. To connect to the layer above or below, it is preferable to be in the correct sequence of the stack up. Additionally due to electrical RF design requirements the trace width and or distance to ground may be different from the trace width and or distance to ground of other layers within the stack up. The Stack up is fired to cure (harden) the green ceramic and conductive material in the vias and trace layers. The exterior surfaces are metalized as specified. In this case Nickel plating. It could also be Silver, Gold, Tungsten, or conductive non-metallic such as graphite.

Figure 4:
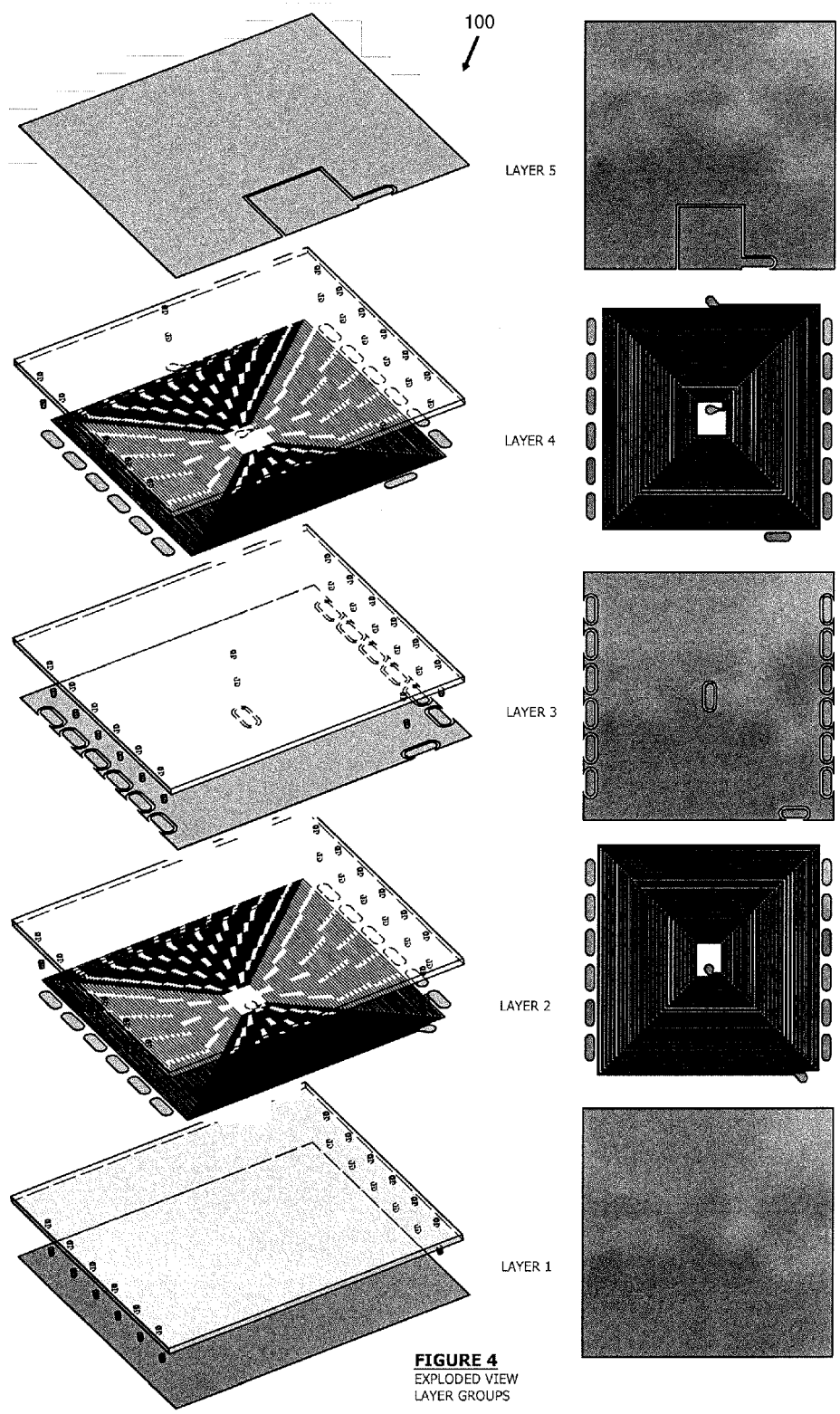
FIG. 4 illustrates an exploded isometric view and a top down view of each of five particular layered groups (1-5; from the bottom to the top) of an RF power resistor assembly in accordance with an embodiment of the present invention.

FIG. 4 shows an exploded isometric view and a top down view of each of five particular layered groups (1-5; from the bottom to the top) of an RF power resistor assembly 100 in accordance with an embodiment of the present invention.

Figure 5:
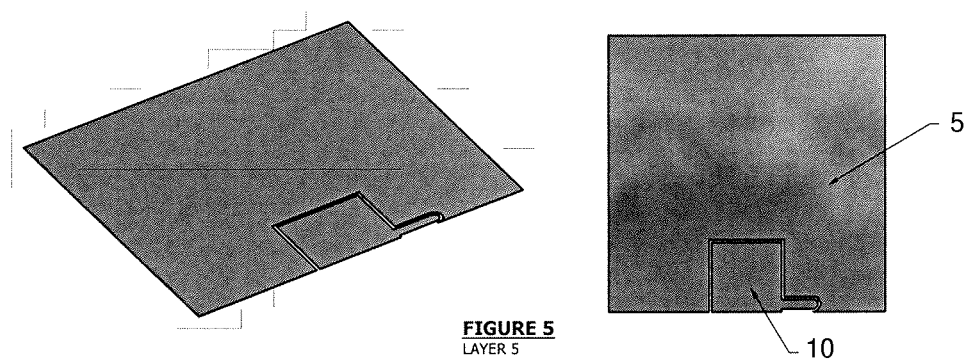
FIG. 5 illustrates an exploded isometric view and a top down view of layer 5, as shown in FIG. 4, in accordance with an embodiment of the present invention.

FIG. 5 shows an exploded isometric view and a top down view of layer 5, as shown in FIG. 4, in accordance with an embodiment of the present invention. The first/top conductive ground layer 5 and the input pad 10 on the top surface of the top conductive ground layer 5 are shown.

Figure 6:
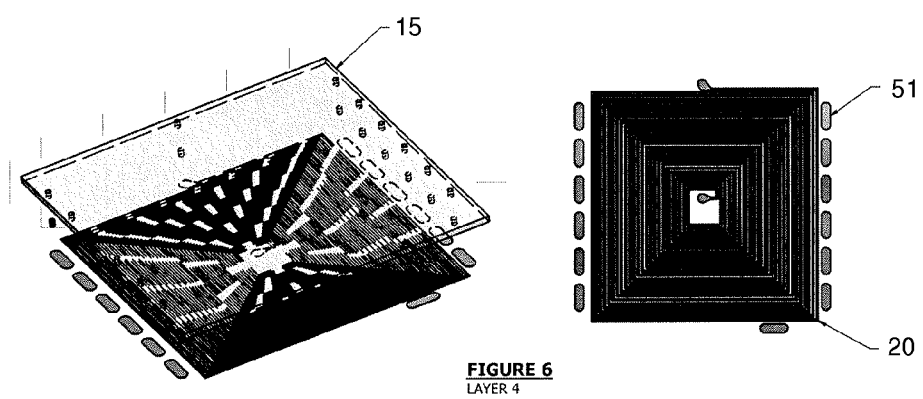
FIG. 6 illustrates an exploded isometric view and a top down view of layer 4, as shown in FIG. 4, in accordance with an embodiment of the present invention.

FIG. 6 shows an exploded isometric view and a top down view of layer 4, as shown in FIG. 4, in accordance with an embodiment of the present invention. The first dielectric layer 15, first trace layer 20, and conductive pad(s) 51 for via(s) 50 are shown.

Figure 7:
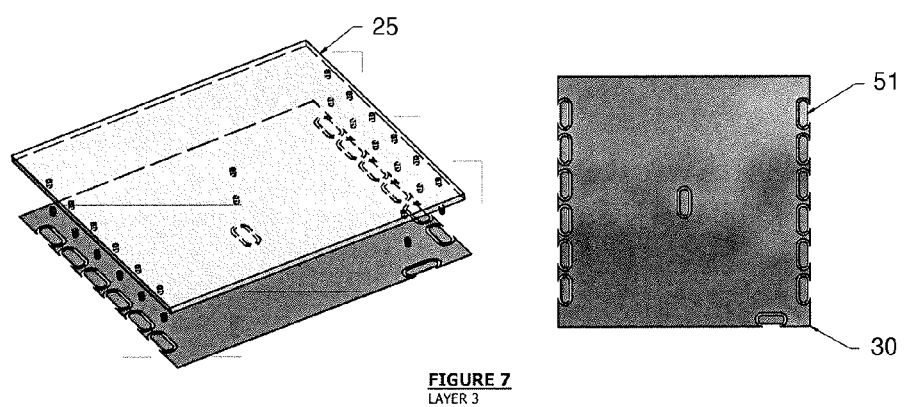
FIG. 7 illustrates an exploded isometric view and a top down view of layer 3, as shown in FIG. 4, in accordance with an embodiment of the present invention.

FIG. 7 shows an exploded isometric view and a top down view of layer 3, as shown in FIG. 4, in accordance with an embodiment of the present invention. The second dielectric layer 25, conductive pad(s) 51 for via(s) 50, and the second/central conductive layer 30 are shown.

Figure 8:
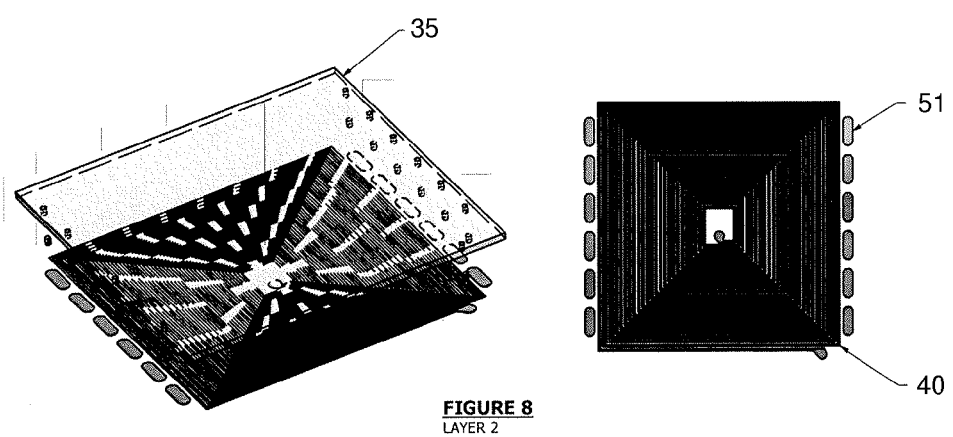
FIG. 8 illustrates an exploded isometric view and a top down view of layer 2, as shown in FIG. 4, in accordance with an embodiment of the present invention.

FIG. 8 shows an exploded isometric view and a top down view of layer 2, as shown in FIG. 4, in accordance with an embodiment of the present invention. The third dielectric layer 35, conductive pad(s) 51 for via(s) 50, and the second trace layer 40 are shown.

Figure 9:
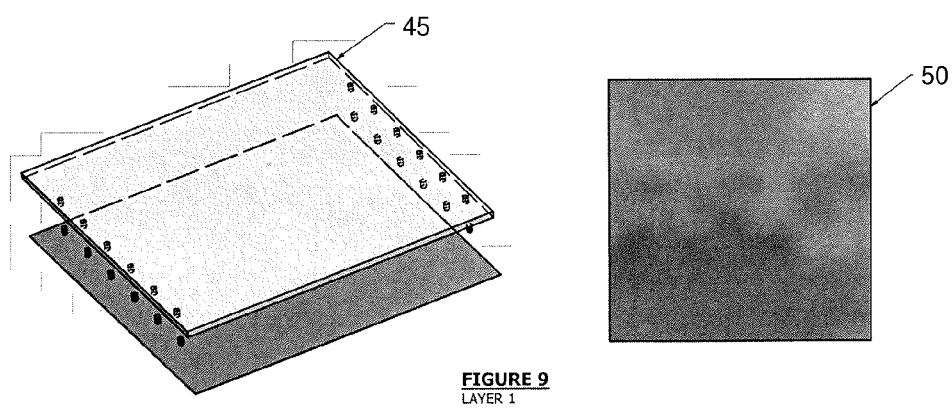
FIG. 9 illustrates an exploded isometric view and a top down view of layer 1, as shown in FIG. 4, in accordance with an embodiment of the present invention.

FIG. 9 illustrates an exploded isometric view and a top down view of layer 1, as shown in FIG. 4, in accordance with an embodiment of the present invention. The fourth dielectric layer 45 and the third/bottom conductive ground layer 50 are shown.

Figure 10:
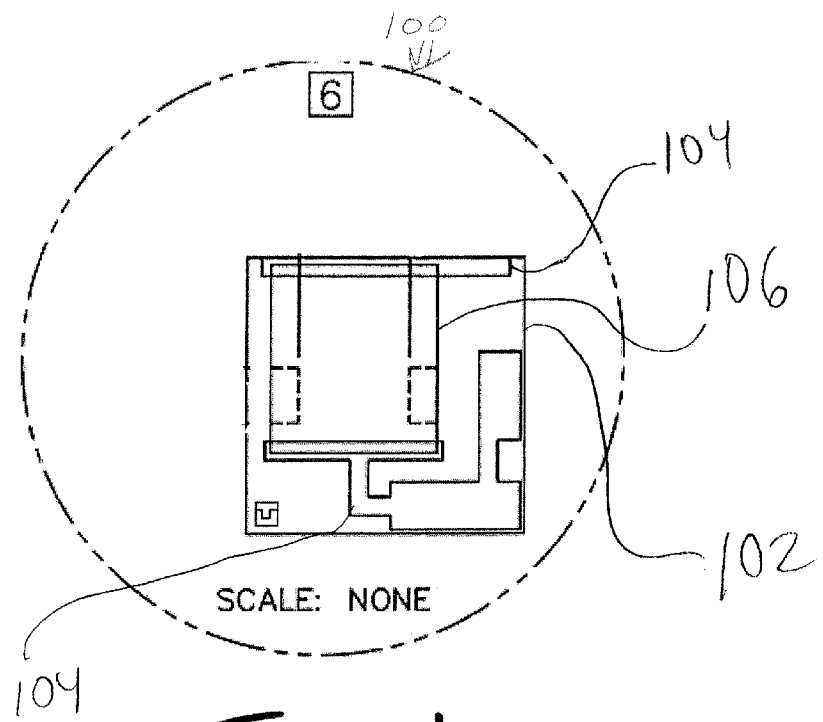
FIG. 10 shows an orthographic top view of a prior art RF power resistor.

The RF Power assembly of an embodiment of the present invention has one or more of the following features:

(1) Selection of materials to have a very high Maximum Operating Temperature (MOT). The MOT of a part is limited by the lowest subcomponent MOT and temperature distribution. For the AlN/Tungsten combination with ENIG plating the MOT is >900 deg C. As stated historical terminations have a MOT of 200 to 250 deg C. The resistive film is the limiting material. Increasing the MOT is critical for two reasons: (a) increased power handling—Power Handling is defined by the equation: $Q=dT/R$ Where Q is dissipated Power, dT is the temperature differential between $T_{Hot}-T_{cold}$ ($T_{Hot}$ is the MOT of the Device and $T_{Cold}$ is the Boundary Condition temperature to the mounting interface of the device), and R is the Thermal resistance of the Device. By increasing the MOT, the power handling will be increased; (b) increased reliability—Devices Run at their MOT will have a defined Operating Life span. Devices operated below their MOT will have an increased Operating life. This is typically referred to as Derating. For high reliability application (Military, Life Critical) resistors are derated 20 to 50%. If a device exhibits poor reliability in qualification testing it will be further derated (operated at lower MOT, which means lower Dissipated Power) to achieve the required Design Life;

(2) The selected material combination (AlN and Tungsten) have similar Coefficient of Thermal Expansion (CTE). As a material changes temperature (heats or cools) it changes size due them to material CTE. This is important for the following reasons: (a) if 2 or more materials are connected but have different CTEs when they change temperature they will expand or contract at different rates. This results in the materials applying force on the opposing material. This is defined as Thermal Stress. If the resulting stress is sufficient failure will occur. This is a common issue with historical termination for the following reasons—the CTE of the Ceramic and the Resistive Film are not matched;

(3) more even Power Distribution within the materials—Lower Heat Flux per unit volume of the device. This results in an even distribution of the dissipated power through the device. This is accomplished by utilizing the RF Stripline and/or Mircrostrip construction methodologies. These design techniques result in two modes of power dissipation (a) Conductor losses due to $I^2R$ losses—Power Dissipated in the Tungsten traces. Since Tungsten has a high resistivity than gold or silver there will be more power dissipated in the conductor as heat; (b) Dielectric Loss—Power dissipated in the Dielectric material. When viewed as a RF dielectric, AlN is considered a high Dielectric Loss material which results in increased Dielectric Loss and correspondingly increase dissipation of the RF power as heat; (c) Geometry—As discussed above and illustrated in FIG. 3 trace layers, the RF signal follows the conductive traces through the device. The traces are sized and spaced in accordance to RF design rules. As illustrated the traces can be in a pattern to utilize the entire footprint of the device from a thermal analysis. As heat spreads through a material it spreads in all dimensions (3D). For basic hand calculations a good approximation is to assume that the heat spreads in a 45 deg angle from the source. Consequently if a trace is the same distance from the edge as the dielectric material is thick, the layout has achieved optimum usage of the area for heat transfer. As opposed to historical resistors, reference FIG. 10, in which the power is only dissipated in the resistive film which is limited to 50% of the ceramic footprint. While historical resistor have the majority of the power dissipated in the resistive film and effectively no Dielectric Loss;

(4) Reliability Increase due to lack micro-cracks. Historic terminations require tuning to achieve consistent performance due to manufacturing variations. This is accomplished by using a laser to remove area from the resistive Film. When this is done it results in micro cracks in the Resistive Film. These micro cracks are point of stress concentration and result in crack propagation when the device is subjected to thermal cycling (heating and cooling), which has two consequences; (a) First the RF performance changes due to the crack propagation due to the change of the Resistive Film Area; (b) Secondly the effective area for power dissipation will be reduced as the cracks propagate, which results in increased temperature. With the lossy trace approach, as provided herein, tuning is not required, therefore eliminating the micro cracks.

As discussed above, an embodiment of the present invention may be implemented as a microstrip (trace on top side of dielectric with ground layer on the bottom side of the dielectric) device. An embodiment of the present invention may be implemented as a stripline device (trace generally centered between two dielectric layers with ground on the top and bottom of the dielectric). For example, the device may be implemented as a single trace/stripline layer. On the other hand, the device may be implemented as using stacked multiple trace/stripline layers. Moreover, the present invention may be implemented as a surface mount device or as a flange mount device. The bottom layer may be a conductive layer. This conductive layer may act as a ground for the RF signal. This conductive layer may act as an attachment point (by soldering, brazing or other technique) to surface mount or flange mount. The embodiments of the present invention include a good thermal path for the amount of heat they will dissipate in use. In flange mount embodiments, the input may be from the top surface to a pad which is connected to the lossy trace. Vias or edge wrap can be used to interconnect multiple trace layers as required. Vias or edge wrap can be used to connect the input pad to the first trace layer as required. Vias or edge wrap can be used to connect the ground layers as required.

All references, including publications, patent applications, and patents, cited herein are hereby incorporated by reference to the same extent as if each reference were individually and specifically indicated to be incorporated by reference and were set forth in its entirety herein.

Any and all published documents mentioned herein shall be considered to be incorporated by reference, in their respective entireties. The following definitions are provided for claim construction purposes:

Present invention: means "at least some embodiments of the present invention," and the use of the term "present invention" in connection with some feature described herein shall not mean that all claimed embodiments (see DEFINITIONS section) include the referenced feature(s).

Embodiment: a machine, manufacture, system, method, process and/or composition that may (not must) be within the scope of a present or future patent claim of this patent document; often, an "embodiment" will be within the scope of at least some of the originally filed claims and will also end up being within the scope of at least some of the claims as issued (after the claims have been developed through the process of patent prosecution), but this is not necessarily always the case; for example, an "embodiment" might be covered by neither the originally filed claims, nor the claims as issued, despite the description of the "embodiment" as an "embodiment."

First, second, third, etc. ("ordinals"): Unless otherwise noted, ordinals only serve to distinguish or identify (e.g., various members of a group); the mere use of ordinals shall not be taken to necessarily imply order (for example, time order, space order).

Electrically Connected: means either directly electrically connected, or indirectly electrically connected, such that intervening elements are present; in an indirect electrical connection, the intervening elements may include inductors, transformers and/or couplings.

Mechanically connected: Includes both direct mechanical connections, and indirect mechanical connections made through intermediate components; includes rigid mechanical connections as well as mechanical connection that allows for relative motion between the mechanically connected components; includes, but is not limited, to welded connections, solder connections, connections by fasteners (for example, nails, bolts, screws, nuts, hook-and-loop fasteners, knots, rivets, quick-release connections, latches and/or magnetic connections), force fit connections, friction fit connections, connections secured by engagement caused by gravitational forces, pivoting or rotatable connections, and/or slidable mechanical connections.

Receive/provide/send/input/output: unless otherwise explicitly specified, these words should not be taken to imply: (i) any particular degree of directness with respect to the relationship between their objects and subjects; and/or (ii) absence of intermediate components, actions and/or things interposed between their objects and subjects.

Substantially radio frequency or radio frequency (RF): refers to signals in the radio frequency range, or signals in other frequency ranges (if any) that behave substantially as proper radio frequency signals with respect to power resistor performance; this document will refer to signals strictly limited to the proper radio frequency range (as conventionally understood) as proper-RF signals, and resistors therefor as proper-RF resistors.

Lossy material: any material which is electrically conductive, but which is substantially lossier than copper, with respect to transmission of electrical current; lossy materials are not necessarily limited to metals.

Heat resistant material: any material that is substantially more heat resistant than typical circuit board material.

Unless otherwise explicitly provided in the claim language, steps in method or process claims need only be performed that they happen to be set forth in the claim only to the extent that impossibility or extreme feasibility problems dictate that the recited step order be used. This broad interpretation with respect to permissible ordering of steps in method claims even if the specification portion of this document only recites one particular ordering of the method steps and does not explicitly recognize alternative possible time ordering of the claimed steps in a method claim. Unless otherwise specified in the method claims themselves, steps may be performed simultaneously or in any sort of temporally overlapping (or partially temporally overlapping) manner. Also, when any method claim in this document does include explicit language regarding time ordering of the steps of the method claim, the time ordering claim language (for example, "subsequent to step A, perform step B") shall not necessarily be taken as an implicit limitation on whether claimed steps are immediately consecutive in time, or as an implicit limitation against intervening steps.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An RF power resistor assembly comprising:
   a first trace layer unit shaped and/or sized as a stripline or microstrip structure comprising:
      a first dielectric layer including a first ground layer disposed on a first surface of the first dielectric layer;
      a second ground layer disposed opposite a second side of said first dielectric layer; and
      a first trace layer disposed between said first dielectric layer and said second ground layer.

2. The RF power resistor assembly of claim 1, wherein said first trace layer unit further comprises a second dielectric layer disposed between said first trace layer and said second ground layer.

3. The RF power resistor assembly of claim 2, wherein said second ground layer further comprises an input pad thereon.

4. The RF power resistor assembly of claim 2, wherein said first trace layer is structured to and/or made of a material sufficient to dissipate attenuated power as heat.

5. The RF power resistor assembly of claim 2, wherein at least one of said first or second dielectric layers is structured to and/or made of a material sufficient to dissipate attenuated power as heat.

6. The RF power resistor assembly of claim 2, wherein said first trace layer is made of a conductive metallic material or conductive non-metallic material.

7. The RF power resistor assembly of claim 6, wherein the conductive metallic material is selected from the group consisting of copper, gold, silver, and tungsten.

8. The RF power resistor assembly of claim 6, wherein the conductive non-metallic material is graphite.

9. The RF power resistor assembly of claim 4, wherein said first trace layer is geometrically sized and/or shaped as a spiral.

10. The RF power resistor assembly of claim 2, wherein at least one of said trace layer, said first dielectric layer, and said second dielectric layer is made of a lossy material.

11. The RF power resistor assembly of claim 2, wherein at least one of said first or second dielectric layers is made of heat resistant material.

12. The RF power resistor assembly of claim 2 wherein at least one of said first or second dielectric layers is made of ceramic material.

13. The RF power resistor assembly of claim 2, wherein at least one of said first or second dielectric layers is made of aluminum nitride.

14. The RF power resistor assembly of claim 2, wherein said first trace layer and at least one of said first or second dielectric layers are located to be adjacent to and in contact with each other.

15. The RF power resistor assembly of claim 1, wherein a first end of said first trace layer is open circuited, shorted, terminated, or used as an attenuator with a second port for an output signal.

16. The RF power resistor assembly of claim 11, wherein the first end of said first trace layer includes a termination and is structured to terminate the first trace layer; and
   the termination is one of the following types: reflecting-open-type termination, reflecting-short-type termination; port-for-output-signal-type termination; and other type termination.

17. The RF power resistor assembly of claim 2, further comprising a
   a second trace layer unit comprising:
      a third dielectric layer disposed on a first surface of the first ground layer;
      a fourth dielectric layer including a third ground layer disposed on a first surface of the fourth dielectric layer; and
      a second trace layer disposed between said third dielectric layer and said fourth dielectric layer.

18. The RF power resistor assembly of claim 17, further comprising more than one buried vias extending between at least two different layers.

19. The RF power resistor assembly of claim 17, further comprising more than one ground vias extending between at least two different layers.

20. The RF power resistor assembly of claim 19, wherein each of said more than one ground vias are connected to at least one conductive pad on one of the at least two different layers.

* * * * *